United States Patent [19]

Parker

[11] Patent Number: 5,270,642

[45] Date of Patent: Dec. 14, 1993

[54] PARTITIONED BOUNDARY-SCAN TESTING FOR THE REDUCTION OF TESTING-INDUCED DAMAGE

[75] Inventor: Kenneth P. Parker, Fort Collins, Colo.

[73] Assignee: Hewlett-Packard Company, Palo Alto, Calif.

[21] Appl. No.: 883,084

[22] Filed: May 15, 1992

[51] Int. Cl.$^5$ ............................................. G01R 31/28
[52] U.S. Cl. .................................. 324/158 R; 371/22.3
[58] Field of Search ................... 371/22.1, 22.3, 22.6, 371/25.1; 324/158 R, 73.1

[56] References Cited

U.S. PATENT DOCUMENTS

| | | | |
|---|---|---|---|
| 4,509,008 | 4/1985 | DasGupta et al. | 324/73 R |
| 4,720,672 | 1/1988 | Turino | 324/158 R |
| 4,875,003 | 10/1989 | Burke | 371/25.1 |
| 5,027,353 | 6/1991 | Jarwala et al. | 371/27 |
| 5,043,987 | 8/1991 | Stark et al. | 371/22.1 |
| 5,054,024 | 10/1991 | Whetsel | 371/22.1 |
| 5,068,604 | 11/1991 | Van de Lagemaat | 324/158 R |
| 5,070,296 | 12/1991 | Priebe | 324/158 R |
| 5,159,598 | 10/1992 | Welles, II et al. | 371/22.1 |

FOREIGN PATENT DOCUMENTS

| | | | |
|---|---|---|---|
| 0382184 | 8/1990 | European Pat. Off. | 371/22.3 |
| 0279320 | 5/1990 | German Democratic Rep. | 371/22.3 |
| 2180355A | 3/1987 | United Kingdom | |

OTHER PUBLICATIONS

"HP Boundary Scan Tutorial and BSDL Reference Guide" by Hewlett-Packard, Dec. 1990, pp. I-28 to I-40.

"IEEE Proposed Standard Testability Bus—An Update with Case Histories", Dec. 1988, pp. 334-337, by Jon Turino, IEEE Conf. on Computer Design.

"Scan Design at NEC", by Funatsu, IEEE Design & Test of Computers, pp. 50-57, Dec. 1989.

"A Universal Test and Maintenance Controller for Modules and Boards", by Lien et al, IEEE Trans. on Indust. Elect., May 1989, vol. 36, #2, pp. 231-240.

"The Impact of Boundary Scan on Board Test", by Parker, pp. 18-29, Aug. 1989, IEEE Design & Test of Computers.

Jarwala et al., "A New Framework for Analyzing Test Generation and Diagnosis Algorithms for Wiring Interconnects", 1989 International Test Conference, 1989 IEEE, Paper 3.3, pp. 63-70.

Robinson et al., "Interconnect Testing of Boards with Partial Boundary Scan" 1990 International Test Conference, 1990 IEEE, Paper 27.3, pp. 572-581.

Primary Examiner—Ernest F. Karlsen

[57] ABSTRACT

A partitioned boundary-scan interconnect test method for loaded printed wiring boards (PWB's) is disclosed which reduces testing-induced damage to electronic components. The method is adapted to expeditiously identify all short-circuits on a PWB. The partitioned boundary-scan interconnect test includes four sub-tests. A powered shorts boundary-scan sub-test searches for short-circuit faults between conventional nets and boundary-scan nets. A boundary-scan interconnect shorts sub-test searches for short-circuits between boundary-scan nets. The boundary-scan interconnect shorts sub-test is optimized by testing a single driver on each net. All other drivers are tested during a boundary-scan bus-wire sub-test. A boundary-scan in-circuit sub-test checks the connectivity of boundary-scan devices in partial boundary-scan nets (i.e., nets having a driver or receiver but not both). By partitioning the boundary-scan interconnect test into these sub-tests, the potential for testing-induced damage is reduced.

20 Claims, 5 Drawing Sheets

PARTITIONED BOUNDARY-SCAN TESTING FOR THE REDUCTION OF TESTING-INDUCED DAMAGE

BACKGROUND OF THE INVENTION

1. Field of the Invention

The present invention relates to the field of boundary-scan interconnect testing of circuit boards. More specifically, the invention relates to a method for reducing the possibility of testing-induced component damage.

2. Background Art

Testing complex digital circuitry at the circuit board level is frequently performed on an ATE (Automated Test Equipment) system. The HP3070 tester is an example of an ATE system. The HP3070 is available from Hewlett-Packard Company, Palo Alto, Calif. Detailed operational information for the HP3070 is contained in "HP3070 Board Test System User's Documentation Set (1989)" available from Hewlett-Packard under HP part number 44930A.

Testing performed on an ATE system includes functional test and in-circuit test. Functional test conventionally involves providing input signals to the external inputs of a circuit board or printed wiring board under test (hereinafter referred to as a "PWB") and observing output signals from the external outputs of the PWB. This type of testing becomes quite complex for large circuits and can provide only limited diagnostics.

Modern testing increasingly supplements this traditional functional test with in-circuit component test. In-circuit component test is a type of functional test wherein the performance of each digital integrated circuit (IC) is tested as a functional unit. That is, each component (e.g., digital IC) on the PWB is tested as if it were electrically isolated from the surrounding circuit. In order to perform the in-circuit component test, the tester (e.g., ATE) must apply input signals directly to the inputs of a DUT (device under test) and must access the outputs of the DUT to observe the output response.

An ATE system, such as the HP3070, uses a "bed-of-nails" (i.e., probes which directly make contact with device I/O pins from pads on the surface of the PWB) fixture to access the required nodes on a PWB. Unfortunately, the nodal access required by in-circuit test is often hampered by increasing circuit complexity (e.g., miniaturized components, multi-chip modules, ASIC's etcetera) and increasing use of such technologies as surface mount and silicon-on-silicon.

The development of boundary-scan has facilitated in-circuit testing by improving nodal access. Boundary-scan is a standardized (e.g., IEEE Standard 1149.1-1990) test technique which involves devices designed with shift registers placed between each device pin and the internal logic of an IC chip. This provides a tester with access to every input and output signal on the boundary-scan chip, and allows the tester to control the I/O pins independent of the core logic and/or to control the core logic independent of the I/O pins.

A detailed discussion on boundary-scan is provided in IEEE Std 1149.1-1990, "IEEE Standard Test Access Port and Boundary-Scan Architecture," IEEE Standards Board and "HP Boundary-Scan Tutorial and BSDL Reference Guide," Hewlett-Packard Company, HP part number E1017-90001, which are incorporated herein by reference.

Most relevant to the present invention is the use of boundary-scan for interconnect testing. In production testing of circuit boards, device interconnects (e.g., printed circuit traces) are tested prior to mounting components thereon. Likewise, the components are tested prior to mounting on the PWB. Once the components are mounted, it is desirable to re-test the interconnects. This test is called a boundary-scan interconnect test.

The boundary-scan interconnect test seeks to locate problems which are introduced during installation of the integrated circuit chips (IC's) on the PWB. The primary faults include open-circuits, short-circuits, missing or wrong components, and mis-oriented (e.g., rotated 180°) components. Open-circuits frequently result from broken pins or "cold" solder joints. Short-circuits may be caused by excess solder bridging the gap from one IC pin connection to the next.

An interconnect test involves testing each conductive "net" or "node" on the PWB to ensure that it connects the proper devices (e.g., input and/or output buffers of one or more IC chips). A "net" or "node" is defined as an equipotential surface formed by a physical conductor.

Interconnect faults include single-net faults and multi-net faults. Single-net faults involve only one net and include stuck HIGH, stuck LOW and open-circuit faults. Multi-net faults are caused by short-circuits which connect two or more nets. Single-net faults are simple to detect and locate. Multi-net faults, however, can be difficult to diagnose. For example, two short-circuited nets can "alias" (i.e., behave) identically to a third good net such that it is not possible to determine whether the third good net is also involved in the short-circuit. Similarly, it is possible for two short-circuits, each involving two or more nets, to have the identical behavior such that it is not clear whether there is one large short-circuit or two independent short-circuits. This phenomenon is known as "confounding".

The actual outcome of a multi-net fault will depend on the type of nets involved. The three types of nets include: simple nets, wire nets, and three-state nets. A simple net is driven by a single buffer/driver. A wire net is a net which is driven by more than one buffer/driver. A wire net may be either a wire-AND or a wire-OR net. A wire-AND net is a net having drivers which have a dominant LOW state. That is, if two drivers are shorted together, a LOW signal will dominate such that a logical AND of the signals results. A wire-OR net is a net having drivers which have a dominant HIGH state. That is, if two drivers are shorted together, a HIGH signal will dominate such that a logical OR of the signals results. A three-state net is a net which is driven by more than one three-state buffer/driver.

The result of multi-net faults may be deterministic (predictable) or non-deterministic (non-predictable). Deterministic faults include OR-type shorts (i.e., shorts between wire-OR nets), AND-type shorts (i.e., shorts between wire-AND nets), and strong-driver shorts (i.e., a short between nets wherein a dominant driver controls the state of the nets regardless of other drivers). For a more detailed analysis of fault diagnosis, see N. Jarwala and C. W. Yau, "A New Framework for Analyzing Test Generation and Diagnosis Algorithms for Wiring Interconnects," Proceedings of International Test Conference 1989, pp. 63–70 (IEEE Order No.

CH2742-5/0000/0063), which is incorporated herein by reference.

Diagnosing these different types of interconnect faults can be difficult. A single test vector can detect a fault; however, it provides very little diagnostic information. In order to diagnose a fault condition, a plurality of test vectors are required. The plurality of test vectors must be broadcast, captured, and then analyzed for fault diagnosis. The entire boundary-scan test must be executed in order to provide data which can be analyzed for fault diagnosis. The actual length of the test will be determined by the amount of diagnosis desired.

In performing the interconnect boundary-scan test, it is sought to use a test pattern which will detect a fault (i.e., an interconnect problem) and which will provide diagnostic information useful for locating the fault. A single test vector can detect a fault; however, it provides very little diagnostic information. In order to diagnose a fault condition, a plurality of test vectors are required. This plurality of test vectors is called a "test pattern". The entire test pattern must be broadcast and the resulting data captured before it can be analyzed for fault diagnosis. The entire boundary-scan test must be executed in order to provide data which can be analyzed for fault diagnosis.

It is desirable to provide a test pattern which will provide as complete a diagnosis as can be achieved through boundary-scan interconnect test. In addition, it is desirable to keep the test pattern as short as possible because each test vector must be serially shifted into (and out of) the boundary register one bit each test cycle. Unfortunately, these goals are in direct conflict such that brevity is often sacrificed for diagnostic capability and visa versa.

A test pattern which has brevity as its primary concern is called a brief test pattern. Brief test patterns tend to provide limited diagnostics. A "counting" test pattern is an example of a brief test pattern.

A test pattern which is primarily concerned with diagnostic capabilities is called a high diagnostic test pattern. High diagnostic test patterns tend to be lengthy. A "walking ones" test pattern is an example of a brief test pattern. For an in-depth analysis of test pattern algorithms, see co-pending U.S. Pat. Appl. Ser. No. 07/757,162, titled "AN IMPROVED BOUNDARY-SCAN INTERCONNECT TEST METHOD," filed on Sep. 10, 1991; and U.S. Pat. Appl. Ser. No. 07/794,767, titled "ENHANCED BOUNDARY-SCAN INTERCONNECT TEST DIAGNOSIS THROUGH UTILIZATION OF BOARD TOPOLOGY DATA," filed on Nov. 19, 1991; both of which are incorporated herein by reference.

Regardless of the test pattern used for the boundary-scan test, power must be applied to the circuit in order to perform the interconnect test. While this power is applied, any fault that exists on the PWB may be causing stress to one or more components on the PWB. This stress may damage or destroy the components. For example, a short-circuit between two pins of an IC may produce a low-impedance current path inside the IC chip between the positive logic supply voltage ($V_{cc}$) and ground. This type of fault can cause excessive current flow which may destroy bond wires, PWB traces, transistors, etcetera, on the IC chip.

The type of fault which is most likely to cause component damage is a short-circuit. An open-circuit fault rarely poses a damage concern. Damage normally results from excessive current flow through a conductor or other electrical device (e.g., a transistor) which causes excessive heat build-up due to excessive power dissipation (i.e., $I^2R$ losses). The amount of heat built-up is a function of the length of time that energy is delivered to the device. That is, the longer power is applied to the faulted circuit, the greater is the risk of damage. Thus, in order to reduce the likelihood of damage, it is desirable to test a PWB as quickly as possible so that the total elapsed time from power-up to power-down is small enough to prevent component damage. However, as discussed above, the length of a test is directly related to its diagnostic capabilities, and a certain level of diagnosis must be maintained.

Thus, standard boundary-scan testing methodologies tend to be relatively long such that component damage may occur far prior to completion of the test. Further, the standard tests are not capable of indicating a fault until after diagnosis has been performed. This means that it is not possible to stop the test during execution if a short-circuit condition is present, because the short-circuit cannot be identified and located until after the test is completed.

SUMMARY OF THE INVENTION

The invention is a partitioned boundary-scan interconnect test method for testing loaded printed wiring boards (PWB's). The method reduces testing-induced damage to electronic components. This is accomplished by a method which focuses on expeditiously locating short-circuits.

When a PWB is first powered-up, the risk of damage to components from a short-circuit fault is high. The longer that the PWB remains powered, the higher is the risk of component damage (if a short-circuit is present). Thus, it is desirable to test for short-circuit conditions first, and to quickly eliminate such high risk faults. Other faults (e.g., open-circuit faults) can be tested for at a more leisurely pace. The method of the present invention accomplishes this through a boundary-scan test which has been partitioned into four sub-tests.

A POWERED SHORTS BOUNDARY-SCAN SUB-TEST searches for short-circuit faults between conventional nets and boundary-scan nets. A BOUNDARY-SCAN INTERCONNECT SHORTS SUB-TEST searches for short-circuits between boundary-scan nets. The BOUNDARY-SCAN INTERCONNECT SHORTS SUB-TEST is optimized by testing a single driver on each net. All other drivers are tested during a BOUNDARY-SCAN BUS-WIRE SUB-TEST. A BOUNDARY-SCAN IN-CIRCUIT SUB-TEST checks the connectivity of partial boundary-scan nets (i.e., nets having a driver or receiver but not both).

By partitioning the boundary-scan interconnect test into these sub-tests, the potential for testing-induced damage is greatly reduced. The POWERED SHORTS BOUNDARY-SCAN SUB-TEST and the BOUNDARY-SCAN INTERCONNECT SHORTS SUB-TEST are executed first since each is optimized for locating short-circuit faults. Each can be executed in a fraction of the time required to execute a standard boundary-scan interconnect test.

The BOUNDARY-SCAN BUS-WIRE SUB-TEST and the BOUNDARY-SCAN IN-CIRCUIT SUB-TEST are directed to finding open-circuit faults. Thus, these two sub-tests are not time critical and may be executed last.

The foregoing and other objects, features and advantages of the invention will be apparent from the following more particular description of a preferred embodiment of the invention, as illustrated in the accompanying drawings.

DESCRIPTION OF THE PREFERRED EMBODIMENT

The present invention is a method for performing a boundary-scan interconnect test in which the potential for testing-induced component damage is greatly reduced. The invention is now described with reference to the figures, where like reference numbers indicate like elements.

Figure 1:
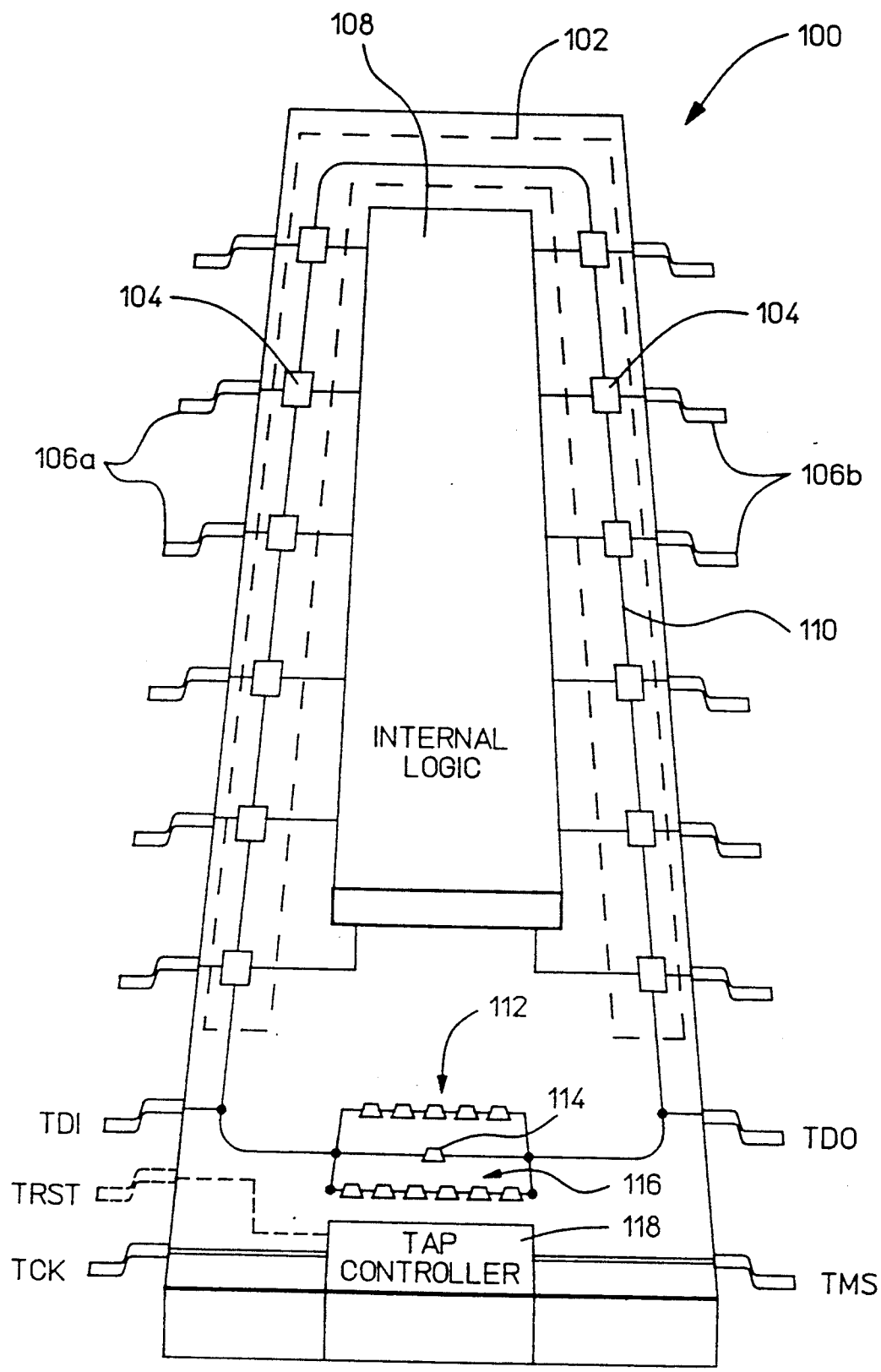
FIG. 1 is a diagram illustrating the structure of a typical boundary-scan device.

A boundary-scan IC chip 100 is shown in FIG. 1. A boundary register 102 is formed from a plurality of boundary register cells 104. Each cell 104 is disposed between an I/O (input/output) terminal 106(a)–(b) and the internal logic 108 of chip 100. As a matter of convention, input terminals 106(a) are shown on the left-hand side of chip 100, and output terminals 106(b) are shown on the right-hand side of chip 100. Some of the I/O terminals may be bidirectional. Bidirectional pins may be fixed as either an input or an output for the duration of the test.

A scanpath or scanchain 110 is formed through boundary register 102. An IDCODE (i.e., identification) register 112, a bypass register 114, and an instruction register 116 are also included in chip 100. IDCODE register 112 provides identification data for chip 100. Bypass register 114 is a one-bit register which allows boundary register 102 to be bypassed. Instruction register 116 decodes instruction bits which are used to select test mode and also to control the operational mode of the chip during test.

A test access port (TAP) controller 118 is a state machine which controls boundary register 102. Five I/O terminals have been added to chip 100 to accommodate boundary-scan. These five terminals constitute the test access port (TAP). A TDI (test data in) terminal provides serial test data and instruction bits to scanpath 110. A TDO (test data out) terminal provides serial output for scanpath 110. A TCK (test clock) terminal provides an independent test clock to chip 100. A TMS (test mode select) terminal provides the logic levels needed to change the state of TAP controller 118. A TRST (test rest) terminal is used to reset chip 100. The TRST terminal, shown in phantom, is optional.

Figure 2:
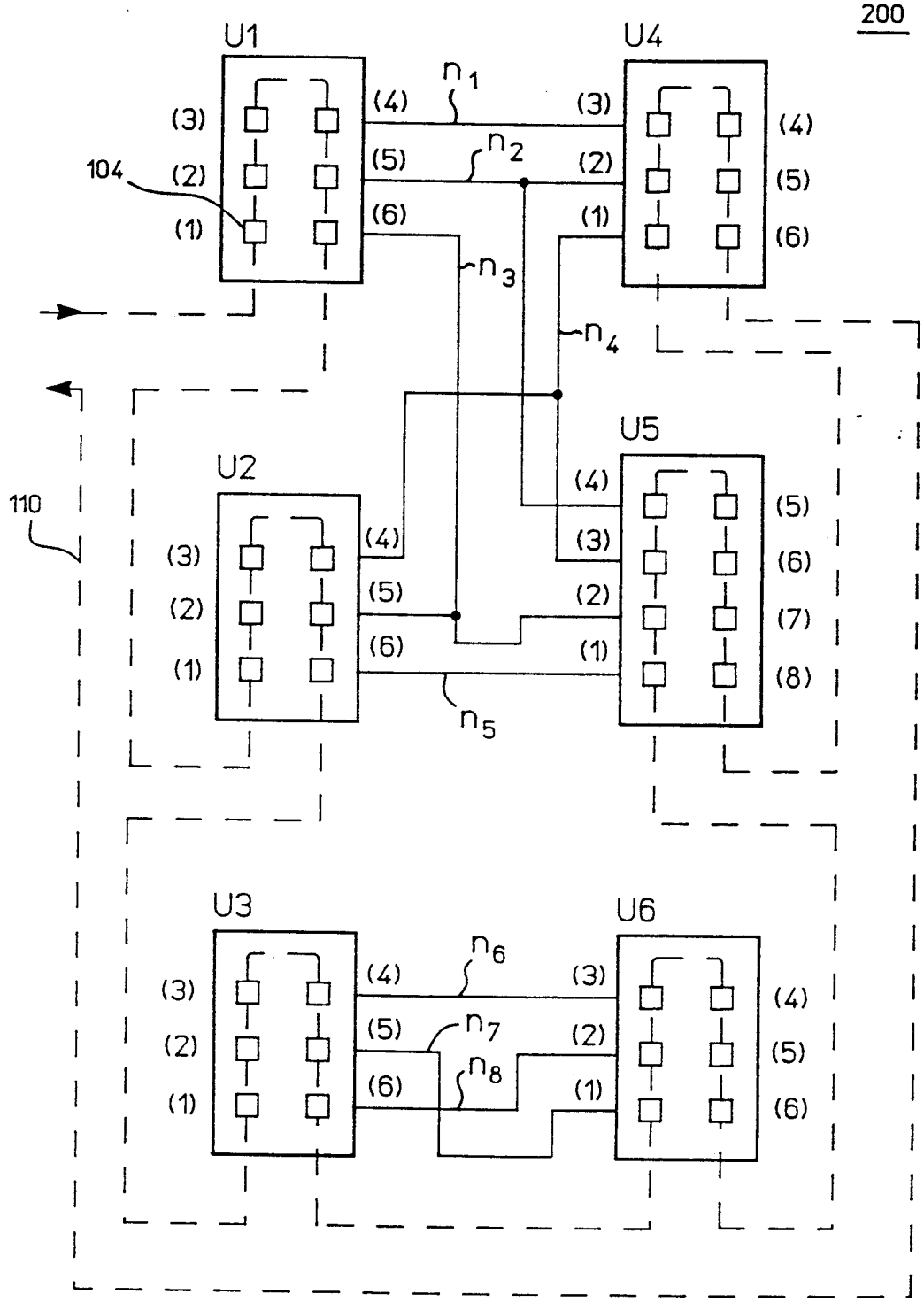
FIG. 2 is a schematic diagram of a sample circuit used to illustrate boundary-scan testing.

A sample circuit 200 to be tested is shown in FIG. 2. Circuit 200 includes six interconnected IC's U1–U6. Boundary register cells 104 are shown in each IC. Following convention, input cells are shown on the left-hand side of each IC, and output cells are shown on the right-hand side of each IC. Each pin of each IC is numbered consecutively from the lower left-hand corner and is referenced by that number along with the IC reference number. For example, U1-3 refers to pin 3 of U1.

A scanpath 110 is shown connecting register cells 104 of IC's U1–U6. Cells 104 is scanpath 110 form the boundary register (102 in FIG. 1). A net $n_1$ connects U1-4 to U4-3. A net $n_4$ connects U1-5 to U4-2 and U5-4. A net $n_3$ connects U1-6 and U2-5 to U5-2. A net $n_4$ connects U2-4 to U4-1 and U5-3. A net $n_5$ connects U2-6 to U5-1. A net $n_6$ connects U3-4 to U6-3. A net $n_7$ connects U3-5 to U6-1. A net $n_8$ connects U3-6 to U6-2.

Figure 3:
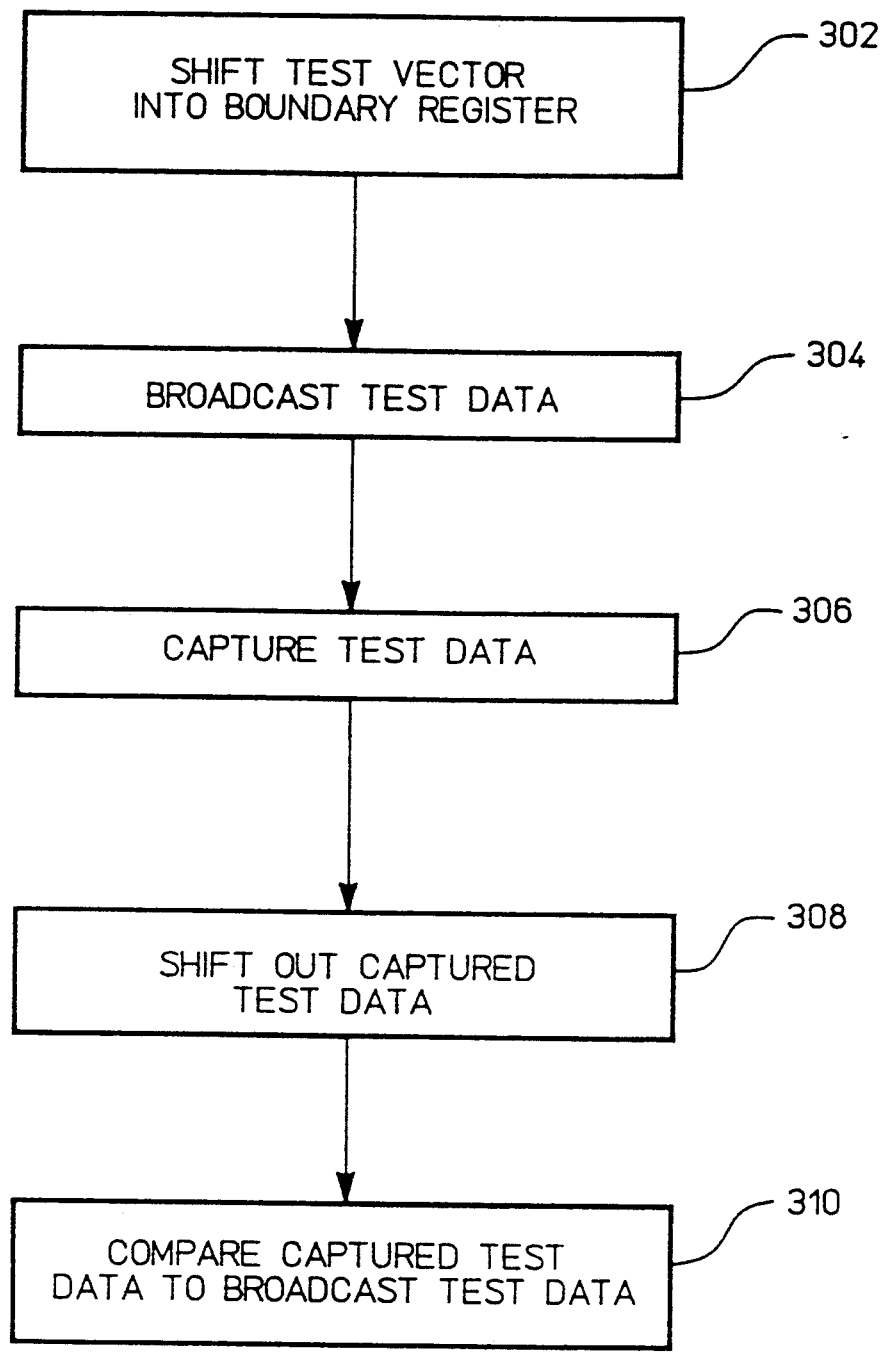
FIG. 3 is a flow chart showing the steps involved in performing a boundary-scan test.

The method of boundary-scan interconnect testing circuit 200 is shown in FIG. 3. At step 302, a test vector (i.e., test data) is serially shifted into boundary register 102. At step 304, the test vector is broadcast from appropriate output buffers (drivers) over the corresponding nets to receiving input buffers. The broadcast data is then captured into the receiving register cells at step 306. The captured test data is shifted out of boundary register 102 at step 308. Finally, the captured test data is compared to the broadcast test data at step 310. Differences in the captured and broadcast data indicate a fault. Because the captured test data contains information on the condition of the net over which it was broadcast, it is also called a "net signature" herein.

Figure 4:
FIG. 4 is a flow-chart illustrating a complete test for a loaded PWB.

A complete test method 400 for a fully assembled PWB is shown in FIG. 4. In a first step 402, an unpowered short-circuit test is conducted. By "unpowered", it is meant that power is not applied to the components on the PWB. Each net which can be accessed by a test probe of the ATE is tested to assure that it remains electrically isolated from adjacent nets. It is an object of this step to test for short-circuits between any nets to which the tester has access. Because power is not applied to the PWB during execution of this test, the potential for damaging a component is substantially reduced. Thus, it is desirable to test as many nets as possible in this manner.

If, at step 403, a short-circuit is detected during the unpowered short-circuit test of step 402, then testing is stopped at step 405 until a repair can be made. This prevents the short-circuit from causing damage when the PWB is later powered-up (i.e., power is applied). The short-circuit fault is diagnosed at a step 407 and the repair is made at a step 409. Thereafter, testing will resume at step 402.

At a step 404, an unpowered analog test is performed. This step tests all analog components, which can be accessed by a probe of the ATE, to assure their proper functioning.

At a step 406, power is applied to the PWB and allowed to stabilize (i.e., settle). Step 408 is then performed without delay. At step 408, the standard boundary-scan interconnect test is conducted. If, at step 410, any short-circuits were detected during the boundary-scan interconnect test of step 408, then testing is stopped at step 405 until a repair can be made. The short-circuit fault is diagnosed at a step 407 and the repair is made at a step 409. Thereafter, testing will resume at step 402.

If no short-circuits are found at step 408, then special boundary-scan tests, if required, are performed at step 412. By "special boundary-scan test", it is meant any test which is custom designed for a particular PWB and which uses the boundary-scan test hardware and methodology. For example, certain integrated circuit chips on the PWB may have built-in self-test features which require that bits be shifted in or out of the chip via the scanpath. Such self-tests can perform very detailed diagnostics with a minimum of input from the scanpath.

At step 414, the PWB is reset by cycling the power OFF and then ON again. The PWB is then ready for conventional digital testing, which is performed at step 416. For example, an edge-connector type functional test may be performed.

After completion of the conventional digital testing at step 416, any special tests, if desired, are conducted at step 418. Testing is then terminated at step 420.

It is at step 408 that the majority of interconnect test fault detection and diagnosis is performed. Accordingly, step 408 tends to be a lengthy test such that the majority of testing induced component damage occurs during that test.

The invention, which is performed at step 408, is a "partitioned" boundary-scan interconnect test method. By "partitioned", it is meant that the boundary-scan interconnect test is separated into a plurality of discreet sub-tests, each of which is much shorter in duration than the standard boundary-scan interconnect test (discussed above). The partitioned boundary-scan interconnect test provides a greatly reduced potential for component damage while maintaining high diagnostic capabilities.

Partitioning reduces testing-induced component damage in two ways. First, until all dangerous short-circuit conditions have been eliminated, test time is not wasted diagnosing more benign faults (e.g., open-circuits). Second, diagnosing the test data from each sub-test is greatly simplified such that faults are easier to locate. This means that simpler test patterns can be used.

The partitioned boundary-scan interconnect test of the present invention includes the following four sub-tests:

1. POWERED SHORTS BOUNDARY-SCAN SUB-TEST,
2. BOUNDARY-SCAN INTERCONNECT SHORTS SUB-TEST,
3. BOUNDARY-SCAN BUS WIRE SUB-TEST, and
4. BOUNDARY-SCAN IN-CIRCUIT SUB-TEST.

Tests (1) and (2) are directed to detecting and diagnosing short-circuit faults.

Tests (3) and (4) are directed to finding open-circuit faults.

1. POWERED SHORTS BOUNDARY-SCAN SUB-TEST

The POWERED SHORTS BOUNDARY-SCAN SUB-TEST (hereinafter referred to as the "POWERED SHORTS SUB-TEST" for ease of discussion) is adapted to locate short-circuits which may occur in a "mixed circuit". A "mixed circuit" is a circuit which contains both conventional circuit elements and boundary-scan elements. The presence of conventional circuit elements (i.e., non-boundary-scan devices) leads to "conventional nets". A "conventional net" is a net which can only be accessed using a test probe of the ATE and cannot be accessed via boundary-scan. A net which can be accessed via boundary-scan is called a "boundary-scan net".

Testing of a mixed circuit presents an additional problem to the test programmer because the presence of the non-boundary-scan elements may compromise the standard boundary-scan test (hereinafter referred to as the "standard test" for ease of discussion). That is, a short-circuit between a conventional net and a boundary-scan net will often cause the boundary-scan net to have the wrong logic value. However, the results of the fault may not be repeatable since the conventional net is powered ON so that its state is not predictable. Further, the boundary-scan net may be able to overdrive (i.e., force to a similar logic state) the conventional net, especially when the conventional net is a high impedance net. When this happens, the short-circuit will not be detected by the standard test.

The POWERED SHORTS SUB-TEST is designed specifically to locate short-circuits between boundary-scan nets and conventional nets on a PWB. A test probe of the ATE is used to set the value of the conventional net when the sub-test is run so that the boundary-scan net will feel the influence of the value forced on the conventional net by the test probe, if the nets are short-circuited together. The conventional net is driven "hard". By "hard", it is meant that the test probe provides sufficient current source/sink capabilities so that a short-circuited boundary-scan node would not be capable of overdriving the logic value on the conventional net.

A more detailed discussion on boundary-scan testing of mixed circuits is provided in G. Robinson and J. Deshayes, "Interconnect Testing of Boards with Partial Boundary Scan," 1990 International Test Conference, Paper 27.3, pp. 572–581, IEEE Order No. CH2910-6/0000/0472$01.00, 1990; and in co-pending U.S. Pat. appl. Ser. No. 07/817,014, entitled "POWERED TESTING OF MIXED CONVENTIONAL/-BOUNDARY-SCAN LOGIC, filed Jan. 3, 1992, both of which are incorporated herein by reference.

In sum, it is an object of the POWERED SHORTS SUB-TEST to quickly find short-circuit faults between boundary-scan nets and conventional nets. Further, it is useful for detecting a short-circuit to a conventional net which is normally not driven hard enough to interfere with a boundary-scan net. Note, however, that the POWERED SHORTS SUB-TEST tends to be lengthy such that it may be desirable to skip this sub-test in certain circumstances, such as, where the sub-test is considered too risky for certain critical components. If the sub-test is skipped, then short-circuit faults between these two types of nets may be difficult to detect.

The POWERED SHORTS BOUNDARY-SCAN SUB-TEST includes the following steps. First, a conventional net is selected for test. It may be selected based on its radial proximity to a boundary-scan net or based on other criteria which makes it a likely location for the occurrence of a short-circuit. The selected conventional net is then contacted with a tester probe and driven to a predetermined logic value. Thereafter, the sub-test proceeds substantially as shown in FIG. 3. That is, a test vector is scanned into the circuit via a scanpath, broadcast from the output drivers, captured by a plurality of receiving register cells, and finally, scanned out of the receiving register cells via the scanpath. This method is repeated for the plurality of test vectors which make up the particular test pattern being used. After the entire test pattern has been applied to the PWB, then the power to the PWB is turned OFF, and the captured test vectors are analyzed to diagnose any short-circuit faults occurring between the selected conventional net and any boundary-scan nets.

2. BOUNDARY-SCAN INTERCONNECT SHORTS SUB-TEST

The BOUNDARY-SCAN INTERCONNECT SHORTS SUB-TEST (hereinafter referred to as the "INTERCONNECT SHORTS SUB-TEST" for ease of discussion) is adapted to locate short-circuits between boundary-scan nets. This sub-test is similar to the standard test, however, the sub-test has been modified to optimize it for the efficient location of short-circuits (rather than both open-circuits and short-circuit as with the standard test).

The optimization involves eliminating bus wire testing from the sub-test. In a net which has more than one driver connected to it, the term "bus wire" refers to the portion of the conductive net which connects the drivers together. For example, referring to FIG. 2 discussed above, note that net $n_3$ is driven by two drivers (U1-6 and U2-5). The conductor which connects U1-6 and U2-5 is a bus wire.

Bus-wire testing is included in the standard test. Therefore, the INTERCONNECT SHORTS SUB-TEST is a sub-set of the standard test. The inventor has discovered, however, that bus wire testing at this stage is unnecessary and merely complicates and lengthens the testing.

In order for the INTERCONNECT SHORTS SUB-TEST to efficiently locate short-circuits, it is not necessary for each driver in a net to be tested. Rather, a single driver may be used to test the selected net for short-circuits. The remaining drivers need only be tested to assure that their connection to the bus wire is not open-circuited.

Accordingly, a single driver in each net is selected for use during the INTERCONNECT SHORTS SUB-TEST. Each selected driver is known as a "designated driver". The other drivers (which have not been selected) will be added to a list of non-designated drivers. The non-designated drivers will be tested, after completion of the interconnect shorts test, during the BOUNDARY-SCAN BUS WIRE SUB-TEST, as described below.

In the preferred embodiment of the invention, the test pattern used for the INTERCONNECT SHORTS SUB-TEST is a modified counting sequence. This test pattern trades off the ability to diagnose aliasing for a shorter test time which is directed to preventing testing induced damage to components on the PWB. Each net identifier in the modified counting sequence includes the following:

(a) a k bit counting sequence, where $k = \log_2 N$ (rounded to the next highest integer) and N = the number of nets on the PWB;
(b) a ZERO or LOW bit;
(c) a ONE or HIGH bit; and
(d) three anti-aliasing bits which are the complement of the least significant three bits of the k-bit counting sequence.

This yields a k-bit counting sequence plus five additional bits. This pattern is selected as a compromise solution to the problem of providing a very quick test which can still provide reasonably thorough diagnostics. While the pattern is directed to finding virtually all short-circuits, it will also find many open-circuits.

The modified counting pattern used in this sub-test can be classified as a "brief test pattern" since the focus of the test is on brevity rather than exhaustive diagnostics. One of skill in art will recognize that other test patterns may be used to perform the INTERCONNECT SHORTS SUB-TEST and that the test pattern set forth above is merely provided as an example of one suitable test.

The BOUNDARY-SCAN INTERCONNECT SHORTS SUB-TEST includes the following steps. First, a single driver is selected or designated for each boundary-scan net. This driver will be used during the sub-test. All other drivers on the boundary-scan nets are disabled. Enabling/disabling of drivers is performed via the boundary register control cells of the boundary-scan components. Thereafter, the sub-test proceeds substantially as shown in FIG. 3. That is, a test vector is scanned into the circuit via a scanpath, broadcast from the designated output drivers, captured by a plurality of receiving register cells, and finally, scanned out of the receiving register cells via the scanpath. This method is repeated for the plurality of test vectors which make up the particular test pattern being used. After the entire test pattern has been applied to the PWB, then the power to the PWB is turned OFF, and the captured test vectors are analyzed to diagnose any short-circuit faults occurring between the boundary-scan nets.

3. BOUNDARY-SCAN BUS WIRE SUB-TEST

The BOUNDARY-SCAN BUS WIRE SUB-TEST (hereinafter referred to as the "BUS WIRE SUB TEST" for ease of reference) is directed to testing whether all untested bus drivers are connected to the bus wire. This test is run after completion of the INTERCONNECT SHORTS SUB-TEST. The INTERCONNECT SHORTS SUB-TEST will prove that no short-circuits exist on the PWB. Thereafter, the BUS WIRE SUB-TEST may be run without fear of causing testing induced damage.

As described above, a single driver is selected to drive a net for the INTERCONNECT SHORTS SUB-TEST. Thus, one driver (the one designated) from each boundary-scan net will be tested during that test. Thereafter, all remaining, non-designated drivers must be tested to assure that all bus wires are connected properly. Since the potential for short-circuits has been eliminated, the fault, which must be tested for, is the open-circuit fault.

The BUS WIRE SUB-TEST can test all non-designated drivers in parallel. The number of test vectors required for the test is equal to two times the largest number of drivers in any net to be tested. The factor of two accounts for the fact that each driver will drive both a HIGH and a LOW onto the net during the test.

Because the sub-test must only check for open-circuits, the diagnostics are simple. However, execution of the test may be lengthy since bus nets may have a large number of drivers. The benefit of this sub-test is realized in the INTERCONNECT SHORTS SUB-TEST. Because bus wires are not tested during the INTERCONNECT SHORTS SUB-TEST, a substantial time savings is achieved over the standard test which incorporates the testing of bus wires into a standard, sequentially executed, boundary-scan interconnect test.

The BOUNDARY-SCAN BUS WIRE SUB-TEST includes the following steps. For each boundary-scan net having a plurality of drivers, a driver which was not tested in the BOUNDARY-SCAN INTERCONNECT SHORTS TEST is selected. All other drivers on the boundary-scan nets are disabled. A first test vector is then selected which will test a first logic state of each selected driver. This first test vector is scanned into the circuit via a scanpath, broadcast from the designated output drivers, captured by a plurality of receiving register cells, and finally, scanned out of the receiving register cells via the scanpath.

A second test vector is then selected which will test a second logic state of each selected driver. This second test vector is scanned into the circuit via a scanpath, broadcast from the designated output drivers, captured by a plurality of receiving register cells, and finally, scanned out of the receiving register cells via the scan-path. This method is repeated N times, where N is equal to the largest number of drivers on any one of the boundary-scan nets. Thereafter, the plurality of captured test vectors are analyzed to diagnose any open-circuit faults occurring between the plurality of output drivers in each boundary-scan net.

4. BOUNDARY-SCAN IN-CIRCUIT SUB-TEST

The BOUNDARY-SCAN IN-CIRCUIT SUB-TEST (hereinafter referred to as the "IN-CIRCUIT SUB-TEST" for ease of discussion) is directed to test the connectivity of a boundary-scan device to a net on the PWB, whereas the sub-tests discussed above are directed to testing the interconnectivity between boundary-scan devices on the PWB. That is, this sub-test is performed for nets which are connected to a boundary-scan access driver or receiver, but not both. Such a net is called a "partial boundary-scan net". These are nets for which one function (send or receive) of a signal transfer is supplied by a boundary-scan device while the other function must be supplied by a test probe. For example, a boundary-scan driver may be connected to an edge connector which routes the signal off of the PWB. In order to test such a driver for connectivity, a test probe must interface with the edge connector to receive the transmitted signal.

Whereas the other sub-tests are executed one per PWB, the IN-CIRCUIT SUB-TEST is performed on the device level or partial device level. That is, this sub-test is performed one device (or part of a device) at a time. The tests may be run in parallel (i.e., many devices at a time), however, the tester has a limited number of driver/receiver resources which, for a large circuit, are easily exhausted. Further, the tests are short and may be executed quickly (i.e., 50 per second) such that it is normally acceptable to run the tests in series.

The BOUNDARY-SCAN BUS WIRE SUB-TEST includes the following steps. A partial boundary-scan net on the PWB is selected for test. The net is then contacted with a tester probe. If the partial boundary-scan net includes a boundary-scan driver, then the tester probe will act as a receiver and will receive a test bit broadcast from the driver. If the partial boundary-scan net includes a boundary-scan receiver, then the tester probe will act as a driver and will drive a test bit onto the net. In either case, two bits (testing two logic states) are broadcast and captured to assure a proper connection. Thereafter, the captured test bits are analyzed to diagnose any open-circuit faults occurring in the partial boundary-scan net.

Test Execution

Figure 5:
FIG. 5 is a flow chart of the partitioned boundary-scan interconnect test of the present invention.

The method 500 of the invention is illustrated in FIG. 5. At a step 502, the POWERED SHORTS SUB-TEST is performed. If, at step 504, and short-circuits were identified at step 502, then testing is stopped at step 503. The short-circuit fault may then be diagnosed at a step 505 and the PWB repaired at a step 507. Thereafter, testing will resume at step 502.

If no short-circuits where found at step 502, then the test may continue with step 506. At step 506, the INTERCONNECT SHORTS SUB-TEST is performed. If, at step 508, any short-circuits were identified at step 506, then testing is stopped at step 503. The short-circuit fault may then be diagnosed and repaired at steps 505 and 507.

If no short-circuits where found at step 506, then the test may continue with step 510. At step 510, the BUS WIRE SUB-TEST is performed. Finally, at step 512, the IN-CIRCUIT SUB-TEST is performed. Testing ends at a step 514.

If required, a certain amount of time may be inserted between each of the sub-tests to allow for cooling of components on the PWB and to prevent a residual heat build-up. Residual heat build-up may increase the stress on components.

This partitioned boundary-scan interconnect test provides thorough diagnostics for a PWB. Further, the potential for testing induced damage is greatly reduced since each sub-test can be executed much faster than the standard test.

While the invention has been particularly shown and described with reference to a preferred embodiment thereof, it will be understood by those skilled in the art that various changes in form and details may be made therein without departing from the spirit and scope of the invention.

I claim:

1. A method for reducing testing induced component damage during a boundary-scan interconnect test performed on an electronic circuit, wherein the circuit includes a plurality of integrated circuit chips which are electrically interconnected by a plurality of independent conductive nets, the method comprising the steps of:
   (a) selecting, for each boundary-scan net, a designated driver;
   (b) performing a boundary-scan interconnect shorts sub-test on the circuit using each designated driver to test the circuit for short-circuits occurring between said boundary-scan nets, and discontinuing further testing if a short circuit is found until said short circuit is repaired; and
   (c) performing a boundary-scan bus wire sub-test after completing said boundary-scan interconnect shorts sub-test to test, for each boundary-scan net having a plurality of drivers, the interconnection between each of said plurality of drivers.

2. The method of claim 1, wherein said boundary-scan interconnect shorts sub-test comprises the steps of:
   (1) serially scanning a test vector into the circuit through a scanpath;
   (2) broadcasting said test vector from a plurality of output drivers in the circuit over said boundary-scan nets;
   (3) capturing said test vector into a plurality of receiving register cells in the circuit;
   (4) serially scanning said test vector out of the receiving register cells via said scanpath;
   (5) repeating steps (1) through (4) for a plurality of said test vectors; and
   (6) analyzing said plurality of captured test vectors to diagnose any short-circuit faults occurring between said boundary-scan nets.

3. The method of claim 2, wherein said boundary-scan bus wire sub-test comprises the steps of:
   (1) for each boundary-scan net having a plurality of drivers, selecting a driver to be tested and disabling all other drivers on the boundary-scan net;
   (2) serially scanning a second test vector into the circuit through a scanpath to test a first logic state of each selected driver;
   (3) broadcasting said second test vector from a plurality of output drivers in the circuit over said boundary-scan nets;
   (4) capturing said second test vector into a plurality of receiving register cells in the circuit;

(5) serially scanning said second test vector out of the receiving register cells via said scanpath;

(6) serially scanning a third test vector into the circuit through a scanpath to test a second logic state of each selected driver;

(7) broadcasting said third test vector from a plurality of output drivers in the circuit over said boundary-scan nets;

(8) capturing said third test vector into a plurality of receiving register cells in the circuit;

(9) serially scanning said third test vector out of the receiving register cells via said scanpath;

(10) repeating steps (1) through (9) N times, where N is equal to the largest number of drivers on any one of said boundary-scan nets; and

(11) analyzing said plurality of captured test vectors to diagnose any open-circuit faults occurring between said plurality of output drivers in a boundary-scan net.

4. The method of claim 1, further comprising a step of:

(d) before step (a), performing a powered shorts boundary-scan sub-test to test the circuit for short-circuits occurring between a conventional net and a boundary-scan net.

5. The method of claim 4, wherein said powered shorts boundary-scan sub-test comprises the steps of:

(1) selecting a conventional net for test;

(2) contacting said conventional net with a tester probe;

(3) driving said conventional net to a predetermined logic value using said tester probe;

(4) serially scanning a test vector into the circuit through a scanpath;

(5) broadcasting said test vector from a plurality of output drivers in the circuit over said boundary-scan nets;

(6) capturing said test vector into a plurality of receiving register cells in the circuit;

(7) serially scanning said test vector out of the receiving register cells via said scanpath;

(8) repeating steps (4) through (7) for a plurality of said test vectors; and (9) analyzing said plurality of captured test vectors to diagnose any short-circuit faults occurring between said conventional net and said boundary-scan nets.

6. The method of claim 4, further comprising a step of:

(e) performing a boundary-scan in-circuit test to test the electrical connection between a boundary-scan circuit component and a partial boundary-scan net.

7. The method of claim 6, wherein said boundary-scan in-circuit sub-test comprises the steps of:

(1) selecting a partial boundary-scan net for test, said partial boundary-scan net including a boundary-scan driver;

(2) contacting said partial boundary-scan net with a tester probe;

(3) serially scanning a second test vector into the circuit through a scanpath;

(4) broadcasting said second test vector from said boundary-scan driver over said partial boundary-scan net;

(5) receiving said second test vector at said tester probe;

(6) repeating steps (3) through (5) as required; and (7) analyzing said second test vectors received at step (5) to diagnose any open-circuit faults occurring in said partial boundary-scan net.

8. The method of claim 6, wherein said boundary-scan in-circuit sub-test comprises the steps of:

(1) selecting a partial boundary-scan net for test, said partial boundary-scan net including a boundary-scan receiver;

(2) contacting said partial boundary-scan net with a tester probe;

(3) driving a test bit onto said partial boundary-scan net using said tester probe;

(4) receiving said test bit at said boundary-scan receiver;

(5) repeating steps (3) through (4) as required; and (6) analyzing said test bits received at step (4) to diagnose any open-circuit faults occurring in said partial boundary-scan net.

9. A method for performing a boundary-scan interconnect test on an electronic circuit, comprising the steps of:

(a) performing a powered shorts boundary-scan sub-test on the circuit to detect short-circuit faults occurring between conventional nets and boundary-scan nets in the electronic circuit;

(b) stopping testing and repairing the electronic circuit if any short-circuit faults are detected in step (a);

(c) performing a boundary-scan interconnect shorts sub-test to detect short-circuit faults occurring between boundary-scan nets in the electronic circuit;

(d) stopping testing and repairing the electronic circuit if any short-circuit faults are detected in step (c);

(e) performing a boundary-scan bus wire sub-test to detect open-circuit faults occurring in each boundary-scan net having a plurality of drivers; and (f) performing a boundary-scan in-circuit sub-test to detect open-circuit faults in each partial boundary-scan net in the electronic circuit.

10. The method of claim 9, wherein said boundary-scan interconnect shorts sub-test comprises the steps of:

(1) selecting, for each boundary-scan net, a designated driver;

(2) serially scanning a test vector into the circuit through a scanpath;

(3) broadcasting said test vector from a plurality of output drivers in the circuit over said boundary-scan nets;

(4) capturing said test vector into a plurality of receiving register cells in the circuit;

(5) serially scanning said test vector out of the receiving register cells via said scanpath;

(6) repeating steps (2) through (5) for a plurality of said test vectors; and (7) analyzing said plurality of captured test vectors to diagnose any short-circuit faults occurring between said boundary-scan nets.

11. The method of claim 10, wherein said boundary-scan bus wire sub-test comprises the steps of:

(1) for each boundary-scan net having a plurality of output drivers, selecting a driver to be tested and disabling all other drivers on the boundary-scan net;

(2) serially scanning a second test vector into the circuit through a scanpath to test a first logic state of each selected driver;

(3) broadcasting said second test vector from a plurality of output drivers in the circuit over said boundary-scan nets;
(4) capturing said second test vector into a plurality of receiving register cells in the circuit;
(5) serially scanning said second test vector out of the receiving register cells via said scanpath;
(6) serially scanning a third test vector into the circuit through a scanpath to test a second logic state of each selected driver;
(7) broadcasting said third test vector from a plurality of output drivers in the circuit over said boundary-scan nets;
(8) capturing said third test vector into a plurality of receiving register cells in the circuit;
(9) serially scanning said third test vector out of the receiving register cells via said scanpath;
(10) repeating steps (1) through (9) N times, where N is equal to the largest number of drivers on any one of said boundary-scan nets; and
(11) analyzing said plurality of captured third and fourth test vectors to diagnose any open-circuit faults occurring between said multiple drivers of each boundary-scan net.

12. The method of claim 11, wherein said powered shorts boundary-scan sub-test comprises the steps of:
(1) selecting a conventional net for test;
(2) contacting said conventional net with a tester probe;
(3) driving said conventional net to a predetermined logic value using said tester probe;
(4) serially scanning a fifth test vector into the circuit through a scanpath;
(5) broadcasting said fifth test vector from a plurality of output drivers in the circuit over said boundary-scan nets;
(6) capturing said fifth test vector into a plurality of receiving register cells in the circuit;
(7) serially scanning said fifth test vector out of the receiving register cells via said scanpath;
(8) repeating steps (4) through (7) for a plurality of fifth test vectors; and
(9) analyzing said plurality of captured fifth test vectors to diagnose any short-circuit faults occurring between said conventional net and said boundary-scan nets.

13. The method of claim 12, wherein said boundary-scan in-circuit sub-test comprises the steps of:
(1) selecting a partial boundary-scan net for test, said partial boundary-scan net including a boundary-scan driver;
(2) contacting said partial boundary-scan net with a tester probe;
(3) serially scanning a sixth test vector into the circuit through a scanpath;
(4) broadcasting said sixth test vector from said boundary-scan driver over said partial boundary-scan net;
(5) receiving said sixth test vector at said tester probe;
(6) repeating steps (3) through (5) as required; and
(7) analyzing said sixth test vectors received at step (5) to diagnose any open-circuit faults occurring in said partial boundary-scan net.

14. The method of claim 12, wherein said boundary-scan in-circuit sub-test comprises the steps of:
(1) selecting a partial boundary-scan net for test, said partial boundary-scan net including a boundary-scan receiver;
(2) contacting said partial boundary-scan net with a tester probe;
(3) driving a test bit onto said partial boundary-scan net using said tester probe;
(4) receiving said test bit at said boundary-scan receiver;
(5) repeating steps (3) through (4) as required; and
(6) analyzing said test bits received at step (4) to diagnose any open-circuit faults occurring in said partial boundary-scan net.

15. A method for performing boundary-scan interconnect testing of an electronic circuit, wherein the electronic circuit includes a plurality of integrated circuit chips which are electrically interconnected by a plurality of independent conductive nets, the plurality of independent conductive nets including both single-driver nets and multi-driver nets, said method comprising the steps of:
(a) designating a driver on each multi-driver net, each said designated driver to be used to test the interconnectivity of each multi-driver net;
(b) performing a boundary-scan interconnect shorts test on said electronic circuit using a diagnostic test pattern which includes a plurality of test vectors and said designated drivers to detect short-circuit faults between said plurality of independent conductive nets;
(c) stopping testing and repairing the electronic circuit, if any short-circuit faults are detected in step (b); and
(d) performing a boundary-scan bus-wire test to test all other drivers on each multi-driver net for open-circuit faults.

16. A method for reducing testing induced component damage during a boundary-scan interconnect test performed on an electronic circuit, wherein the circuit includes a plurality of integrated circuit chips which are electrically interconnected by a plurality of independent conductive nets, comprising the steps of:
(a) performing a powered shorts boundary-scan sub-test to test the circuit for short-circuits occurring between a conventional net and a boundary-scan net;
(b) selecting, for each boundary-scan net, a designated driver;
(c) performing a boundary-scan interconnect shorts sub-test on the circuit using each designated driver to test the circuit for short-circuits occurring between said boundary-scan nets;
(d) performing a boundary-scan bus wire sub-test to test, for each boundary-scan net having a plurality of drivers, the interconnection between each of said plurality of drivers; and
(e) performing a boundary-scan in-circuit test to test the electrical connection between a boundary-scan circuit component and a partial boundary-scan net.

17. The method of claim 16, wherein said boundary-scan in-circuit sub-test comprises the steps of:
(1) selecting a partial boundary-scan net for test, said partial boundary-scan net including a boundary-scan driver;
(2) contacting said partial boundary-scan net with a tester probe;
(3) serially scanning a second test vector into the circuit through a scanpath;
(4) broadcasting said second test vector from said boundary-scan driver over said partial boundary-scan net;

(5) receiving said second test vector at said tester probe;

(6) repeating steps (3) through (5) as required; and (7) analyzing said second test vectors received at step (5) to diagnose any open-circuit faults occurring in said partial boundary-scan net.

18. The method of claim 16, wherein said boundary-scan in-circuit sub-test comprises the steps of:

(1) selecting a partial boundary-scan net for test, said partial boundary-scan net including a boundary-scan receiver;

(2) contacting said partial boundary-scan net with a tester probe;

(3) driving a test bit onto said partial boundary-scan net using said tester probe;

(4) receiving said test bit at said boundary-scan receiver;

(5) repeating steps (3) through (4) as required; and (6) analyzing said test bits received at step (4) to diagnose any open-circuit faults occurring in said partial boundary-scan net.

19. A method for performing a boundary-scan interconnect test on an electronic circuit, comprising the steps of:

(a) performing a powered shorts boundary-scan sub-test on the circuit to detect short-circuit faults occurring between conventional nets and boundary-scan nets in the electronic circuit, said powered shorts boundary-scan sub-test comprises the steps of:

(1) selecting a conventional net for test;

(2) contacting said conventional net with a tester probe;

(3) driving said conventional net to a predetermined logic value using said tester probe;

(4) serially scanning a fifth test vector into the circuit through a scanpath;

(5) broadcasting said fifth test vector from a plurality of output drivers in the circuit over said boundary-scan nets;

(6) capturing said fifth test vector into a plurality of receiving register cells in the circuit;

(7) serially scanning said fifth test vector out of the receiving register cells via said scanpath;

(8) repeating steps (a)(4) through (a)(7) for a plurality of fifth test vectors; and (9) analyzing said plurality of captured fifth test vectors to diagnose any short-circuit faults occurring between said conventional net and said boundary-scan nets;

(b) stopping testing and repairing the electronic circuit if any short-circuit faults are detected in step (a);

(c) performing a boundary-scan interconnect shorts sub-test to detect short-circuit faults occurring between boundary-scan nets in the electronic circuit, said boundary-scan interconnect shorts sub-test comprises the steps of:

(1) selecting, for each boundary-scan net, a designated driver;

(2) serially scanning a test vector into the circuit through a scanpath;

(3) broadcasting said test vector from a plurality of output drivers in the circuit over said boundary-scan nets;

(4) capturing said test vector into a plurality of receiving register cells in the circuit;

(5) serially scanning said test vector out of the receiving register cells via said scanpath;

(6) repeating steps (c)(2) through (c)(5) for a plurality of said test vectors; and (7) analyzing said plurality of captured test vectors to diagnose any short-circuit faults occurring between said boundary-scan nets;

(d) stopping testing and repairing the electronic circuit if any short-circuit faults are detected in step (c);

(e) performing a boundary-scan bus wire sub-test to detect open-circuit faults occurring in each boundary-scan net having a plurality of drivers, said boundary-scan bus wire sub-test comprises the steps of:

(1) for each boundary-scan net having a plurality of output drivers, selecting a driver to be tested and disabling all other drivers on the boundary-scan net;

(2) serially scanning a second test vector into the circuit through a scanpath to test a first logic state of each selected driver;

(3) broadcasting said second test vector from a plurality of output drivers in the circuit over said boundary-scan nets;

(4) capturing said second test vector into a plurality of receiving register cells in the circuit;

(5) serially scanning said second test vector out of the receiving register cells via said scanpath;

(6) serially scanning a third test vector into the circuit through a scanpath to test a second logic state of each selected driver;

(7) broadcasting said third test vector from a plurality of output drivers in the circuit over said boundary-scan nets;

(8) capturing said third test vector into a plurality of receiving register cells in the circuit;

(9) serially scanning said third test vector out of the receiving register cells via said scanpath;

(10) repeating steps (e)(1) through (e)(9) N times, where N is equal to the largest number of drivers on any one of said boundary-scan nets; and

(11) analyzing said plurality of captured third and fourth test vectors to diagnose any open-circuit faults occurring between said multiple drivers of each boundary-scan net; and (f) performing a boundary-scan in-circuit sub-test to detect open-circuit faults in each partial boundary-scan net in the electronic circuit, said boundary-scan in-circuit sub-test comprises the steps of:

(1) selecting a partial boundary-scan net for test, said partial boundary-scan net including a boundary-scan driver;

(2) contacting said partial boundary-scan net with a tester probe;

(3) serially scanning a sixth test vector into the circuit through a scanpath;

(4) broadcasting said sixth test vector from said boundary-scan driver over said partial boundary-scan net;

(5) receiving said sixth test vector at said tester probe;

(6) repeating steps (f)(3) through (f)(5) as required; and (7) analyzing said sixth test vectors received at step (5) to diagnose any open-circuit faults occurring in said partial boundary-scan net.

20. A method for performing a boundary-scan interconnect test on an electronic circuit, comprising the steps of:

(a) performing a powered shorts boundary-scan sub-test on the circuit to detect short-circuit faults occurring between conventional nets and boundary-scan nets in the electronic circuit, said powered shorts boundary-scan sub-test comprises the steps of:
  (1) selecting a conventional net for test;
  (2) contacting said conventional net with a tester probe;
  (3) driving said conventional net to a predetermined logic value using said tester probe;
  (4) serially scanning a fifth test vector into the circuit through a scanpath;
  (5) broadcasting said fifth test vector from a plurality of output drivers in the circuit over said boundary-scan nets;
  (6) capturing said fifth test vector into a plurality of receiving register cells in the circuit;
  (7) serially scanning said fifth test vector out of the receiving register cells via said scanpath;
  (8) repeating steps (a)(4) through (a)(7) for a plurality of fifth test vectors; and
  (9) analyzing said plurality of captured fifth test vectors to diagnose any short-circuit faults occurring between said conventional net and said boundary-scan nets;

(b) stopping testing and repairing the electronic circuit if any short-circuit faults are detected in step (a);

(c) performing a boundary-scan interconnect shorts sub-test to detect short-circuit faults occurring between boundary-scan nets in the electronic circuit, said boundary-scan interconnect shorts sub-test comprises the steps of:
  (1) selecting, for each boundary-scan net, a designated driver;
  (2) serially scanning a test vector into the circuit through a scanpath;
  (3) broadcasting said test vector from a plurality of output drivers in the circuit over said boundary-scan nets;
  (4) capturing said test vector into a plurality of receiving register cells in the circuit;
  (5) serially scanning said test vector out of the receiving register cells via said scanpath;
  (6) repeating steps (c)(2) through (c)(5) for a plurality of said test vectors; and
  (7) analyzing said plurality of captured test vectors to diagnose any short-circuit faults occurring between said boundary-scan nets;

(d) stopping testing and repairing the electronic circuit if any short-circuit faults are detected in step (c);

(e) performing a boundary-scan bus wire sub-test to detect open-circuit faults occurring in each boundary-scan net having a plurality of drivers, said boundary-scan bus wire sub-test comprises the steps of:
  (1) for each boundary-scan net having a plurality of output drivers, selecting a driver to be tested and disabling all other drivers on the boundary-scan net;
  (2) serially scanning a second test vector into the circuit through a scanpath to test a first logic state of each selected driver;
  (3) broadcasting said second test vector from a plurality of output drivers in the circuit over said boundary-scan nets;
  (4) capturing said second test vector into a plurality of receiving register cells in the circuit;
  (5) serially scanning said second test vector out of the receiving register cells via said scanpath;
  (6) serially scanning a third test vector into the circuit through a scanpath to test a second logic state of each selected driver;
  (7) broadcasting said third test vector from a plurality of output drivers in the circuit over said boundary-scan nets;
  (8) capturing said third test vector into a plurality of receiving register cells in the circuit;
  (9) serially scanning said third test vector out of the receiving register cells via said scanpath;
  (10) repeating steps (e)(1) through (e)(9) N times, where N is equal to the largest number of drivers on any one of said boundary-scan nets; and
  (11) analyzing said plurality of captured third and fourth test vectors to diagnose any open-circuit faults occurring between said multiple drivers of each boundary-scan net; and (f) performing a boundary-scan in-circuit sub-test to detect open-circuit faults in each partial boundary-scan net in the electronic circuit, said boundary-scan in-circuit sub-test comprises the steps of:
  (1) selecting a partial boundary-scan net for test, said partial boundary-scan net including a boundary-scan receiver;
  (2) contacting said partial boundary-scan net with a tester probe;
  (3) driving a test bit onto said partial boundary-scan net using said tester probe;
  (4) receiving said test bit at said boundary-scan receiver;
  (5) repeating steps (f)(3) through (f)(4) as required; and
  (6) analyzing said test bits received at step (4) to diagnose any open-circuit faults occurring in said partial boundary-scan net.

* * * * *

UNITED STATES PATENT AND TRADEMARK OFFICE
CERTIFICATE OF CORRECTION

PATENT NO. : 5,270,642
DATED : Dec. 14, 1993
INVENTOR(S) : Kenneth P. Parker

It is certified that error appears in the above-indentified patent and that said Letters Patent is hereby corrected as shown below:

Col. 1, l. 50: After "ASIC's" insert --,--

Col. 8, l. 25: Delete "appl" and insert therefor --Appl--

Col. 8, ls. 60-62: Delete "ls. 60-62" and insert therefor--ventional net and any boundary-scan nets.-- Line 61, insert therefor 2 spaces before and after --2-- then insert therefor --BOUNDARY-SCAN INTERCONNECT SHORTS SUB-TEST--

Signed and Sealed this

Fifth Day of December, 1995

Attest:

BRUCE LEHMAN

Attesting Officer

Commissioner of Patents and Trademarks